US012666897B2

(12) United States Patent
Lee et al.

(10) Patent No.: US 12,666,897 B2
(45) Date of Patent: Jun. 23, 2026

(54) PRE-CLEAN CHAMBER ASSEMBLY ARCHITECTURE FOR IMPROVED SERVICEABILITY

(71) Applicant: Applied Materials, Inc., Santa Clara, CA (US)

(72) Inventors: Songjae Lee, San Jose, CA (US); Avinash Shervegar, Karnataka (IN); Srinivasa Rangappa, Bangalore (IN); Sundarapandiyan Shanmugam, Bangalore (IN); Ernesto J. Ulloa, San Jose, CA (US); Vinodh Ramachandran, Bangalore (IN); Abraham Palaty, Bangalore (IN); Jaidev Rajaram, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 223 days.

(21) Appl. No.: 17/529,684

(22) Filed: Nov. 18, 2021

(65) Prior Publication Data

US 2023/0154766 A1    May 18, 2023

(51) Int. Cl.
H10P 72/00        (2026.01)
H10P 72/76        (2026.01)

(52) U.S. Cl.
CPC ...... H10P 72/0402 (2026.01); H10P 72/7602 (2026.01)

(58) Field of Classification Search
CPC .......... H01L 21/67017; H01L 21/68707; H01J 2237/332–3348
USPC ................................................. 118/715, 719
See application file for complete search history.

(56) References Cited

U.S. PATENT DOCUMENTS

| | | | |
|---|---|---|---|
| 5,855,681 A | 1/1999 | Maydan et al. | |
| 6,598,279 B1 * | 7/2003 | Morgan ............... | H01R 13/005 29/25.01 |
| 7,767,024 B2 | 8/2010 | Kao et al. | |
| 8,395,078 B2 | 3/2013 | Ilic | |

(Continued)

FOREIGN PATENT DOCUMENTS

| | | |
|---|---|---|
| JP | H0964149 A | 3/1997 |
| JP | 2005101598 A | 4/2005 |

(Continued)

OTHER PUBLICATIONS

International Search Report and Written Opinion dated Oct. 20, 2022 for Application No. PCT/US2022/034478, 9 pages.

(Continued)

*Primary Examiner* — Charlee J. C. Bennett
(74) *Attorney, Agent, or Firm* — Patterson + Sheridan, LLP

(57)        ABSTRACT

Apparatus for processing a substrate are described herein. More specifically, embodiments described herein relate to separate pre-clean process modules and pre-clean control modules coupled to a cluster tool assembly. Each pre-clean process module and each pre-clean control module are connected by a cable conduit which is configured to have power and control cables passing therethrough between the pre-clean process module and the ore-clean control module. A maintenance passage is formed through the cluster tool assembly. Each of a purge gas source, a process gas source, a manometer, an isolation port, and a throttle valve are all accessible from one side of the pre-clean process module.

11 Claims, 6 Drawing Sheets

(56) References Cited

U.S. PATENT DOCUMENTS

| | | | | |
|---|---|---|---|---|
| 8,884,180 | B2 | 11/2014 | Ilic | |
| 9,870,921 | B2 | 1/2018 | Olsen et al. | |
| 2002/0073922 | A1* | 6/2002 | Frankel | C23C 16/4405 |
| | | | | 118/715 |
| 2002/0179436 | A1* | 12/2002 | Anderson | H01L 21/6723 |
| | | | | 204/269 |
| 2003/0213560 | A1 | 11/2003 | Wang et al. | |
| 2006/0156979 | A1 | 7/2006 | Thakur et al. | |
| 2006/0213446 | A1* | 9/2006 | Atlas | C23C 16/4482 |
| | | | | 118/726 |
| 2007/0020890 | A1* | 1/2007 | Thakur | H10P 72/0461 |
| | | | | 118/719 |
| 2007/0207706 | A1* | 9/2007 | Takahashi | H01L 21/67766 |
| | | | | 451/28 |
| 2008/0044595 | A1 | 2/2008 | Thakur et al. | |
| 2008/0072820 | A1* | 3/2008 | Burrows | H01L 21/67017 |
| | | | | 118/642 |
| 2009/0301774 | A1* | 12/2009 | Byrne | E04F 15/024 |
| | | | | 174/483 |
| 2010/0116205 | A1* | 5/2010 | Newman | H01L 21/6719 |
| | | | | 118/715 |
| 2010/0140231 | A1* | 6/2010 | Ilic | H01J 37/32045 |
| | | | | 219/121.54 |
| 2010/0158642 | A1* | 6/2010 | Duer | H01L 21/67167 |
| | | | | 414/217 |
| 2010/0173495 | A1 | 7/2010 | Thakur et al. | |
| 2012/0079982 | A1* | 4/2012 | Lubomirsky | F26B 25/004 |
| | | | | 34/209 |
| 2012/0210937 | A1 | 8/2012 | Thakur et al. | |
| 2013/0180964 | A1 | 7/2013 | Ilic | |
| 2016/0066478 | A1* | 3/2016 | Van Den Bergen | |
| | | | | H05K 7/20754 |
| | | | | 361/679.47 |
| 2016/0133491 | A1* | 5/2016 | Thirunavukarasu | |
| | | | | H01L 21/67389 |
| | | | | 414/805 |
| 2018/0272390 | A1* | 9/2018 | Ulloa | H01L 21/67303 |

| | | | | |
|---|---|---|---|---|
| 2019/0062904 | A1 | 2/2019 | Hawrylchak et al. | |
| 2020/0051837 | A1 | 2/2020 | Lin et al. | |
| 2022/0199436 | A1* | 6/2022 | Merry | H01L 21/67196 |
| 2023/0010499 | A1* | 1/2023 | Kirkpatrick | H10P 70/20 |

FOREIGN PATENT DOCUMENTS

| | | |
|---|---|---|
| JP | 2006022375 A | 1/2006 |
| JP | 2008521261 A | 6/2008 |
| JP | 2009543354 A | 12/2009 |
| JP | 2010283211 A | 12/2010 |
| JP | 2012035803 A | 2/2012 |
| JP | 2012511241 A | 5/2012 |
| JP | 2013179309 A | 9/2013 |
| JP | 2016521000 A | 7/2016 |
| KR | 20080034465 A | 4/2008 |
| KR | 20200035186 A | 4/2020 |
| WO | 2006055984 | 5/2006 |
| WO | 2007011666 A2 | 1/2007 |
| WO | 2008005754 A2 | 1/2008 |
| WO | 2010065942 A1 | 6/2010 |
| WO | 2019046453 A1 | 3/2019 |

OTHER PUBLICATIONS

Office Action for Korean Application No. 10-2024-7002697 dated Dec. 10, 2024.

Office Action for Japanese Application No. 2024-504176 dated Jan. 28, 2025.

Extended European Search Report for European Application No. 22896272.6 dated Dec. 5, 2025.

Office Action for Taiwan Application No. 111127125 dated Sep. 30, 2025.

Search Report for Taiwan Application No. 111127125 dated Sep. 26, 2025.

Office Action for Japanese Application No. 2024-504176 dated Sep. 30, 2025.

Office Action from Chinese Patent Application No. 202210861573.8 dated Jan. 13, 2026.

* cited by examiner

PRE-CLEAN CHAMBER ASSEMBLY ARCHITECTURE FOR IMPROVED SERVICEABILITY

BACKGROUND

Field

Embodiments of the present disclosure generally relate to a system for substrate processing. More specifically, embodiments described herein relate to a system for performing a pre-clean process on substrates for semiconductor processing.

Description of the Related Art

Pre-cleaning of a substrate is performed either before or between substrate processing operations. Pre-cleaning of a substrate reduces the contamination of the substrate and may remove unwanted residue or materials from a surface of the substrate before processing operations are performed. Pre-clean chambers are attached to a portion of a processing tool, such as a linear or cluster tool. Once the pre-clean chambers are attached to the processing tool, substrates are run through the pre-clean chamber during processing operations. The volume inside of a pre-clean chamber is in fluid communication with a volume inside of at least a portion of the processing tool, such as a transfer chamber.

Current semiconductor manufacturing facilities utilize an increasing number of processing tools as technology evolves. Maintenance of each of the processing tools after installation is performed to enable improved long-term processing results. Maintenance of pre-clean chambers is performed to improve cleaning performance. Maintenance is often difficult to perform due to space constraints between processing tools. Therefore, the maintenance often requires prolonged tool down-time, which increases the overall cost of ownership and decreases the usability of the tool. Previous attempts to reduce the maintenance times and cost have led to increased chamber footprints. The footprint and serviceable area of processing tools are therefore limiting factors in the quantity and type of tools utilized within semiconductor manufacturing facilities.

Therefore, what is needed in the art are processing tools with decreased footprints and improve accessible maintenance points.

SUMMARY

The present disclosure generally relates to apparatus for processing a substrate, such as apparatus suitable for use in semiconductor manufacturing. In one embodiment, the apparatus includes a transfer chamber, a factory interface coupled to a first side of the transfer chamber, a plurality of process chambers coupled to the a second side of the transfer chamber, and a pre-clean process module coupled to the a third side of the transfer chamber between the factory interface and at least one of the plurality of process chambers. The pre-clean process module includes a pre-clean chamber and a gas panel disposed below the pre-clean chamber. A pre-clean control module is disposed separate from the pre-clean process module and adjacent to one of the plurality of process chambers. The pre-clean control module includes a power supply and a controller. A cable conduit is disposed between the pre-clean process module and the pre-clean control module.

In another embodiment, a pre-clean assembly suitable for use in semiconductor manufacturing is described. The pre-clean assembly includes a pre-clean process module. The pre-clean process module includes a pre-clean chamber comprising a lid, a substrate support pedestal, and a plate stack. The lid is rotatable about an axis of rotation. A gas panel is disposed below the pre-clean chamber. An isolation port is disposed on a first side of the pre-clean process module and extends in a first direction. A manometer is disposed on the first side and extends in the first direction. A pre-clean control module is disposed separate from the pre-clean process module and includes a power supply and a controller. A cable conduit is disposed between the pre-clean process module and the pre-clean control module. The cable conduit has a length of greater than about 400 mm.

In yet another embodiment, an apparatus for substrate processing suitable for use in semiconductor manufacturing is described. The apparatus includes a transfer chamber, a factory interface coupled to a first side of the transfer chamber, four process chambers coupled to the transfer chamber, a first pre-clean process module coupled to a second side of the transfer chamber between the factory interface and a first of the process chambers. The first pre-clean process module includes a pre-clean chamber and a gas panel disposed below the pre-clean chamber. The pre-clean chamber is coupled to the transfer chamber and further includes a lid with an axis of rotation adjacent to the transfer chamber, such that the lid rotates towards the transfer chamber when opening. A first pre-clean control module is disposed separate from the first pre-clean process module and adjacent to the first of the process chambers. The first pre-clean control module includes a power supply and a controller configured to control a pre-clean process within the pre-clean chamber. A first cable conduit is disposed between the first pre-clean process module and the first pre-clean control module and is configured to hold one or more electric cables and one or more control cables therein.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments described in the present disclosure generally relate to a system for substrate processing. More specifically, embodiments described herein relate to a system for performing a pre-clean process on substrates for semiconductor processing. The system for pre-clean processing includes a pre-clean chamber as well as supporting apparatus. The supporting apparatus include a gas panel and a pre-clean control module. The pre-clean control module includes power supply and a controller. A cable conduit connects the pre-clean module to the pre-clean chamber and one or more electrical or control cables pass through the cable conduit. The pre-clean chamber and the gas panel form a pre-clean process module. The pre-clean process module is separate from the pre-clean control module to enable the footprints of the pre-clean process module and the pre-clean control module to be separated and a maintenance passage to be formed when in combination with a cluster tool. Separating the pre-clean process module and the pre-clean control modules reduces the footprint of the pre-clean process module and enables improved maintenance pathways around both the pre-clean process module and the pre-clean control module. The cable conduit attaching the pre-clean process module and the pre-clean control module enables the distance between the pre-clean process module and the pre-clean control module to be increased while shielding a plurality of power cables and a plurality of control cables from outside interference and interference with each other.

Figure 1:
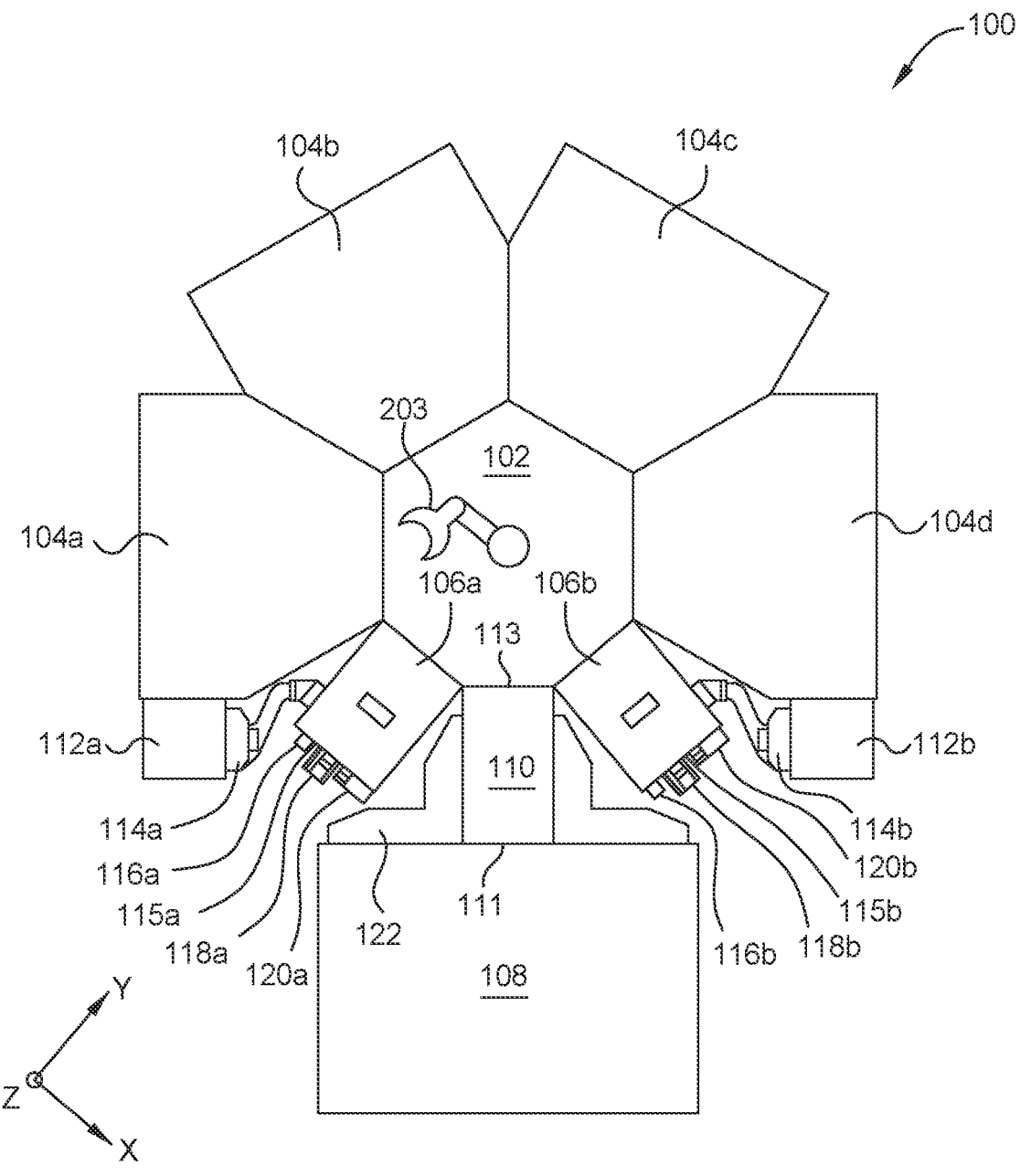
FIG. 1 illustrates a schematic plan view of a cluster tool assembly for processing a substrate, according to embodiments described herein.

FIG. 1 illustrates a schematic plan view of a cluster tool assembly 100 for processing a substrate. The cluster tool assembly 100 includes one or more pre-clean process modules 106a, 106b and one or more pre-clean control modules 112a, 112b. The pre-clean process modules 106a, 106b are coupled to an outer surface of a transfer chamber 102. A plurality of process chambers 104a-104d are further coupled to the outer surface of the transfer chamber 102. In the embodiment of FIG. 1, there are two pre-clean process modules 106a, 106b and four process chambers 104a-104d. One or more load lock chambers 110 are disposed between the transfer chamber 102 and a front end factory interface (FI) 108. A single load lock chamber 110 is disposed between the transfer chamber 102 and the front end FI 108 of FIG. 1. A substrate is passed through the load lock chamber 110 when being transferred from the front end FI 108 to the transfer chamber 102 and from the transfer chamber 102 to the front end FI 108.

The load lock chamber 110 is connected to a vacuum pump (not shown), for example a roughing pump, the output of which is connected to an exhaust duct (not shown), to reduce the pressure within the load lock chamber 110 to a sub-atmospheric pressure on the order of about $10^{-3}$ torr. The load lock chamber 110 may be connected to a vacuum pump dedicated thereto, or a vacuum pump shared with one or more components within the cluster tool assembly 100, or to a house exhaust other than a vacuum pump to reduce the pressure therein. In each case, valves are disposed on either end of the load lock chamber 110.

A first valve 111 is disposed between the load lock chamber 110 and the front end FI 108. A second valve 113 is disposed between the load lock chamber 110 and the transfer chamber 102. The first valve 111 enables a seal to be formed between the front end FI 108 and the load lock chamber 110 while the load lock chamber 110 is being de-pressurized. The first valve 111 further prevents the transfer chamber 102 from being exposed to atmospheric or ambient pressure conditions while the second valve 113 is open and a substrate is being transferred to the load lock chamber 110 from the transfer chamber 102 or from the transfer chamber 102 to the load lock chamber 110. The second valve 113 enables a seal to be formed between the transfer chamber 102 and the load lock chamber 110 while the load lock chamber 110 is pressurized or in fluid communication with the front end FI 108. The second valve 113 prevents the transfer chamber 102 from being exposed to atmospheric or ambient pressure conditions while the first valve 111 is open and a substrate is being transferred to the load lock chamber 110 from the front end FI 108 or from the front end FI 108 to the load lock chamber 110.

The transfer chamber 102 is configured to transfer one or more substrates between each of the load lock chamber 110, the pre-clean process module 106a, 106b, and the process chambers 104a-104d. As shown herein, the transfer chamber 102 includes seven sidewalls, such that the transfer chamber 102 has a heptagonal cross-sectional outline. The transfer chamber 102 may alternatively have a pentagonal, an enneagonal, or a hendecagonal cross-sectional outline to enable additional process chambers to be coupled to the transfer chamber 102. The sidewall of the transfer chamber 102 on which the load lock chamber 110 is attached has a reduced thickness when compared to the sidewalls along which any of the process chambers 104a-104d or the pre-clean process modules 106a, 106b are attached. The transfer chamber 102 may include a transfer robot 203 or a carousel (not shown) for moving a substrate therein. The transfer robot or carousel has one or more blades (not shown) for holding the substrate and is actuated around a central axis (not shown) of the transfer chamber 102. A transfer volume within the transfer chamber 102 is held at a vacuum during substrate processing, such as on the order of about $10^{-3}$ Torr or less.

Each of the process chambers 104a-104d are coupled to the outside surface of the transfer chamber 102. The process chambers 104a-104d may be four process chambers 104a-104d, such that there is a first process chamber 104a, a second process chamber 104b, a third process chamber 104c, and a fourth process chamber 104d. However, more or less process chambers are also contemplated. Each of the plurality of process chambers 104a-104d may be a deposition chamber, such as an epitaxial deposition chambers or other types of deposition chambers. In some embodiments, the process chambers 104a-104d include at least one of an atomic layer deposition (ALD), a chemical vapor deposition (CVD), or a physical vapor deposition (PVD) chamber. Each of the process chambers 104a-104d are disposed on a wall adjacent to at least one additional process chamber 104a-104d.

In the embodiment of FIG. 1, load lock chamber 110 is coupled to a first wall of the transfer chamber 102. The first pre-clean process module 106a is coupled to a second wall of the transfer chamber 102. The first process chamber 104a is coupled to a third wall of the transfer chamber 102. The second process chamber 104b is coupled to a fourth wall of the transfer chamber 102. The third process chamber 104c is coupled to a fifth wall of the transfer chamber 102. The fourth process chamber 104d is coupled to a sixth wall of the transfer chamber 102. The second pre-clean process module 106b is coupled to a seventh wall of the transfer chamber 102.

The walls of the transfer chamber 102 to which the first pre-clean process module 106a and the second pre-clean process module 106b are coupled are shorter in width than the walls of the transfer chamber 102 to which the process chambers 104a-104d are coupled. Therefore, the second wall and the seventh wall of the transfer chamber 102 are shorter in width than each of the third wall, the fourth wall, the fifth wall, or the sixth wall. The wall of the transfer chamber 102 to which the load lock chamber 110 is coupled is also shorter in width than the walls of the transfer chamber 102 to which the process chambers 104a, 104d are coupled. Therefore, the first wall of the transfer chamber 102 is shorter in width than each of the third wall, the fourth wall, the fifth wall, or the sixth wall. Having shorter widths of one or each of the first wall, the second wall, and the third wall reduce the overall footprint of the cluster tool assembly 100, but reduce the space between the pre-clean process modules 106a, 106b and other components of the cluster tool assembly 100.

The load lock chamber 110 is disposed on the first wall between the first pre-clean process module 106a and the second pre-clean process module 106b. The first pre-clean process module 106a is disposed on the second wall between the load lock chamber 110 and the first process chamber 104a. The second pre-clean process module 106b is disposed on the seventh wall between the load lock chamber 110 and the fourth process chamber 104d. The first process chamber 104a is disposed on the third wall between the first pre-clean process module 106a and the second process chamber 103b. The second process chamber 104b is disposed on the fourth wall between the first process chamber 104a and the third process chamber 104c. The third process chamber 104c is disposed on the fifth wall between the second process chamber 104b and the fourth process chamber 104d. The fourth process chamber 104d is disposed on the sixth wall between the third process chamber 104c and the second pre-clean process module 106b.

The first pre-clean control module 112a is disposed adjacent to the first process chamber 104a. In some embodiments, the first pre-clean control module 112a is coupled to the first process chamber 104a. The second pre-clean control module 112b is disposed adjacent to the fourth process chamber 104d. In some embodiments, the second pre-clean control module 112b is coupled to the fourth process chamber 104d.

Each of the pre-clean process modules 106a, 106b are configured to perform a pre-clean process on one or more substrates disposed therein. The pre-clean process may include a plasma etch process. A pre-clean process module 106a, 106b is disposed on either side of the load lock chamber 110, such that a first pre-clean process module 106a is disposed on one side of the load lock chamber 110 and a second pre-clean process module 106b is disposed on an opposite side of the load lock chamber 110 from the first pre-clean process module 106a. The pre-clean process modules 106a, 106b are coupled to a side of the transfer chamber 102 and are configured to be in fluid communication with the transfer volume within the transfer chamber 102. Each of the pre-clean process modules 106a, 106b is coupled to a pre-clean control module 112a, 112b by one or more cable conduits 114a, 114b. The first pre-clean process module 106a is coupled to a first pre-clean control module 112a by a first cable conduit 114a. The second pre-clean process module 106b is coupled to a second pre-clean control module 112b by a second cable conduit 114b.

Each of the pre-clean process modules 106a, 106b includes a manometer 116a, 116b, an isolation port (also referred to as an isolation valve) 118a, 118b, and a throttle valve 120a, 120b extending from an outward facing surface 115a, 115b of the pre-clean process modules 106a, 106b. Therefore, a first manometer 116a, a first isolation port 118a, and a first throttle valve 120a extend from an outward facing surface 115a of the first pre-clean process module 106a. A second manometer 116b, a second isolation port 118b, and a second throttle valve 120b extend from an outward facing surface 115b of the second pre-clean process module 106b. Each of the manometers 116a, 116b, the isolation ports 118a, 118b, and the throttle valves 120a, 120b extend from a single side of each pre-clean process modules 106a, 106b to enable improved access to each of the manometers 116a, 116b, the isolation ports 118a, 118b, and the throttle valves 120a, 120b.

A mainframe power supply 122 is disposed adjacent to the front end FI 108 and the load lock chamber 110. The mainframe power supply 122 may be configured to supply alternating current (AC) power to the cluster tool assembly 100, such as to the transfer chamber 102, the load lock chamber 110, and the front end FI 108. The mainframe power supply 122 may further provide power to the process chambers 104a-104d and/or the pre-clean process modules 106a, 106b. The mainframe power supply 122 may be coupled to the side of the load lock chamber 110 and/or the front end FI 108.

Figure 2:
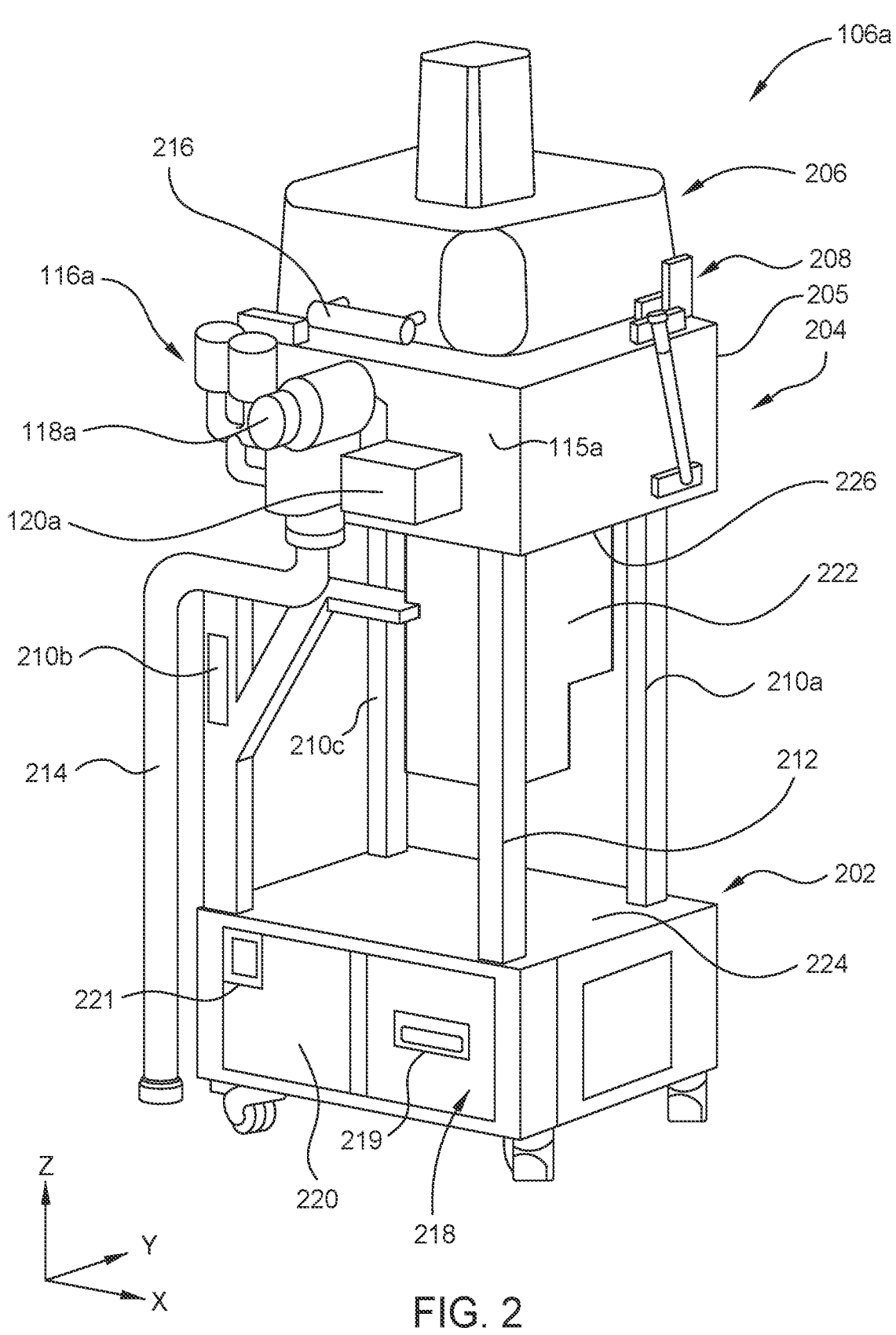
FIG. 2 illustrates a schematic front isometric view of a first pre-clean process module, according to embodiments described herein.

FIG. 2 illustrates a schematic front isometric view of a first pre-clean process module 106a. The second pre-clean module 106b is similar to the first pre-clean module 106a. The first pre-clean process module 106a includes a pre-clean chamber 204, a gas panel 202, a plurality of supports 210a, 210b, 212c, 212, the manometer 116a, the isolation port 118a, and the throttle valve 120a. The pre-clean chamber 204 includes a lid 206, a body 205, a hinge assembly 208 coupling the lid 206 and the pre-clean chamber 204, and a pedestal actuator 222. The pre-clean chamber 204 is disposed above the gas panel 202. The gas panel 202 includes a purge gas panel 220 and a process gas panel 218.

The gas panel 202 is disposed below the pre-clean chamber 204 to reduce the footprint of the first pre-clean process module 106a. The purge gas panel 220 is configures to supply purge gas to the pre-clean chamber 204 and may include one or more purge gas sources and purge gas pumps. The process gas panel 218 is configured to supply process gas to the pre-clean chamber 204 and may include one or more process gas sources, a process gas pump, and/or valves. Each of the purge gas panel 220 and the process gas panel 218 may be accessed through a first door 221 and a second door 219 respectively. The first door 221 and the second door 219 are on an outer wall of the first pre-clean process module 106a.

Each of the plurality of supports 210a, 210b, 210c, 212 are disposed between a top surface 224 of the gas panel 202 and a bottom surface 226 of the body 205 of the pre-clean chamber 204. The plurality of supports 210a, 210b, 210c, 212 include a first support 210a, a second support 210b, a third support 210c, and a removable fourth support 212. Each of the first support 210a, the second support 210b, the third support 210c, and the removable fourth support 212 are disposed at corners of the gas panel 202 and support the pre-clean chamber 204 and separate the pre-clean chamber 204 from the gas panel 202. The removable fourth support 212 is configured be removed once the first pre-clean process module 106a is installed on the cluster tool assembly 100 by coupling the first pre-clean process module 106a to the transfer chamber 102. Removing the removable fourth support 212 opens up the underside of the pre-clean chamber 204 and provides a maintenance passage. The second support 210b may include one or more branches for supporting a portion of the pedestal actuator 222 and/or an exhaust line 214. Each of the supports 210a, 210b, 210c, 212 may alternatively be referred to as legs or spacers.

The hinge assembly 208 is configured to enable the lid 206 to be actuated with respect to the body 205 of the pre-clean chamber 204. The lid 206 further includes a handle 216. The handle 216 is located on a side of the lid 206 opposite the connection to the hinge assembly 208. The handle 216 is located on the same side of the pre-clean chamber 204 as each of the manometer 116a, the isolation port 118a, and the throttle valve 120a. Therefore, the lid 206 is configured to open away from the outward facing surface 115a and towards the transfer chamber 102. Therefore, each of the manometer 116a, the isolation port 118a, the throttle valve 120a, and the pre-clean chamber 204 may have maintenance performed thereon from the same side.

The manometer 116a is configured to measure the temperature within the pre-clean chamber 204. In some embodiments, the manometer 116a measures more than one pressure within the pre-clean chamber 204. The isolation port 118a is configured to control the exhaust rate within the pre-clean chamber 204 and may control the flow of exhaust from the pre-clean chamber 204 to an exhaust line 214. The isolation port 118a may further be utilized to check the vacuum of the pre-clean chamber 204 and determine if a leak is present therein.

The throttle valve 120a is configured to control the flow of gas into the pre-clean chamber 204. The throttle valve 120a may control one or both of the process gases or the purge gases. Process gases may include carrier gases or reactive gases, such as one or a combination of He, Ne, Ar, Kr, Xe, $N_2$, $H_2$, $NH_3$, $NF_3$, $Cl_2$, HCl, HF, HBr, $C_2F_6$, $CF_4$, $C_3F_8$, $CHF_3$, $CH_2F_2$, $C_4F_8$, or $SF_6$. The second pre-clean process module 106b is similar to the first pre-clean process module 106a.

Figures 3A, 3B:
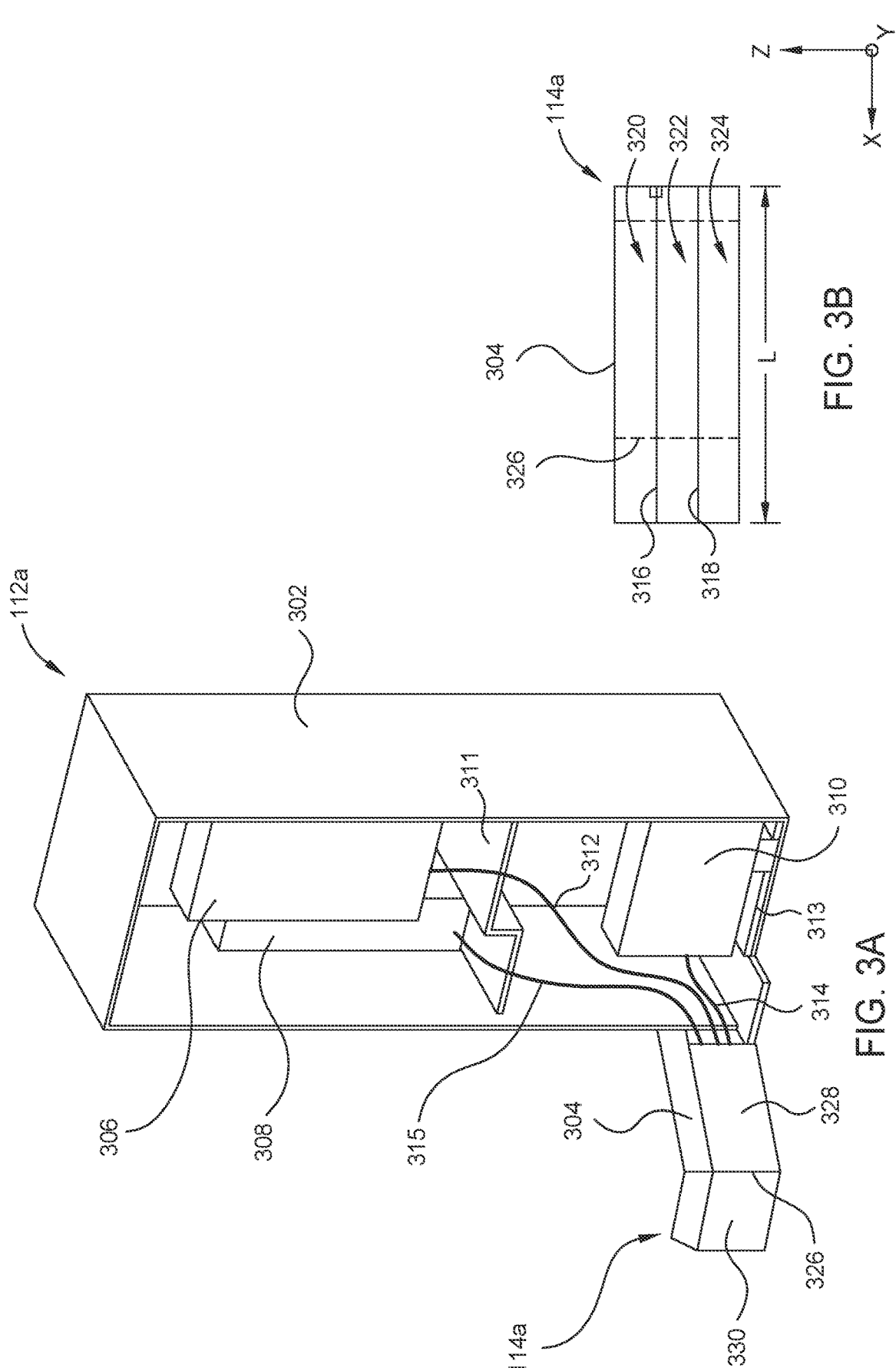
FIG. 3A illustrates a schematic front isometric view of a first pre-clean control module, according to embodiments described herein.
FIG. 3B illustrates a schematic cross-sectional side view of a first cable conduit, according to embodiments described herein.

FIG. 3A illustrates a schematic front isometric view of a first pre-clean control module 112a. The first pre-clean control module 112a and the second pre-clean control module 112b are similar. The first pre-clean control module 112a is configured to control the first pre-clean process module 106a. The first pre-clean control module 112a includes one or more power sources 308, 310, and a controller 306. The controller 306 is configured to control the process operations of the pre-clean chamber 204.

The controller 306 is configured to supply instructions to the pre-clean chamber 204 as well as the power sources 308, 310. The controller 306 further receives input from sensors within the first pre-clean process module 106a. For example, the controller 306 may be configured to control flow of various gases via the gas panel 202 and coordinate operation of the power sources 308, 310 to facilitate gas and plasma flow within the first pre-clean process module 106a. The controller 306 may also be configured to control all aspects of heating within the pre-clean chamber 204 and actuation of the pedestal actuator 222.

The controller 306 includes a programmable central processing unit (CPU) that is operable with a memory and a mass storage device, an input control unit, and a display unit (not shown), such as power supplies, clocks, cache, input/output (I/O) circuits, and the like, coupled to the various components of the pre-clean chamber 204 to facilitate control of substrate processing. The controller 306 also includes hardware or software for monitoring substrate processing through sensors in the pre-clean chamber 204, including sensors monitoring flow, RF power, electric field and the like. Other sensors that measure system parameters such as substrate temperature, chamber atmosphere pressure and the like, may also provide information to the controller 306.

To facilitate control of the pre-clean chamber 204 and associated plasma and electric field formation processes, the CPU may be one of any form of general purpose computer processor that can be used in an industrial setting, such as a programmable logic controller (PLC), for controlling various chambers and sub-processors. The memory is coupled to the CPU and the memory is non-transitory and may be one or more of readily available memory such as random access memory (RAM), read only memory (ROM), floppy disk drive, hard disk, or any other form of digital storage, local or remote. Support circuits are coupled to the CPU for supporting the processor in a conventional manner. The plasma and electric field formation and other processes are generally stored in the memory, typically as a software routine. The software routine may also be stored and/or executed by a second CPU that is remotely located from the hardware being controlled by the CPU.

The memory is in the form of computer-readable storage media that contains instructions, that when executed by the CPU, facilitates the operation of pre-clean chamber 204. The instructions in the memory are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

In certain embodiments, the program(s) embody machine learning capabilities. Various data features include process parameters such as processing times, temperatures, pressures, voltages, polarities, powers, gas species, precursor flow rates, and the like. Relationships between the features are identified and defined to enable analysis by a machine learning algorithm to ingest data and adapt processes being performed by the pre-clean chamber 204. The machine learning algorithms may employ supervised learning or unsupervised learning techniques. Examples of machine learning algorithms embodied by the program include, but are not limited to, linear regression, logistic regression, decision tree, state vector machine, neural network, naïve Bayes, k-nearest neighbors, K-Means, random forest, dimensionality reduction algorithms, and gradient boosting algorithms, among others. In one example, the machine learning algorithm is utilized to modulate RF power and precursor gas flow to form a plasma and then facilitate cleaning of substrates disposed within the pre-clean chamber 204.

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the controller 306 is an etherCAT controller.

Each of the one or more power sources 308, 310 are one of an alternating current (AC) or a direct current (DC) power source. In some embodiments, the one or more power sources 308, 310 are two or more power sources 308, 310. The one or more power sources 308, 310 includes a first power source 308 and a second power source 310. The first power source 308 is a DC power supply and is configured to supply DC power to the first pre-clean process module 106a. The second power source 310 is an AC power supply and is configured to supply AC power to the first pre-clean process module 106a. The combined first power source 308 and the second power source 310 are utilized to supply power to various elements within the first pre-clean process module 106a. The first power source 308 may supply power to one or more of the gas panel 202, heaters (not shown) within the pre-clean chamber 204, the pedestal actuator 222, the manometer 116a, the isolation port 118a, or the throttle valve 120a. In some embodiments, the first power source 308 supplies power to each of the gas panel 202, the heaters within the pre-clean chamber 204, the pedestal actuator 222, the manometer 116a, the isolation port 118a, and the throttle valve 120a. The second power source 310 is configured to supply power to one or more of the heaters (not shown) within the pre-clean chamber 204, a remote plasma source (RPS) 422 (FIG. 4), or sensors within the pre-clean chamber 204.

Each of the first power source 306, the second power source 310, and the controller 306 are disposed within a casing 302. The casing 302 is a tower configured to hold each of the first power source 306, the second power source 310, and the controller 306. The casing 302 is a metal or metal alloy container and may include multiple compartments and/or shelves for holding different electrical components. In some embodiments, each of the first power source 306 and the controller 306 are disposed on an upper shelf 311, while the second power source 310 is disposed on a lower shelf 313 below the upper shelf 311.

Power cables 312, 314 lead from each of the first power source 306 and the second power source 310. The power cables 312, 314 are configured to transfer power to components of the first pre-clean process module 106a. The power cables 312, 314 pass from inside of the casing 302, into a first cable conduit 114a, and to the first pre-clean process module 106a. One or more signal cables 315 extend from the controller 306 to the first pre-clean process module 106a. The one or more signal cables 315 are configured to carry a signal from the controller 306 to the first pre-clean process module 106a and/or carry a signal from one or more components of the first pre-clean process module 106a to the controller 306. The one or more signal cables 315 extend from the controller 306, through the first cable conduit 114a, and to the first pre-clean process module 106a. The first cable conduit 114a serves to shield each of the power cables 312, 314 and the one or more signal cables 315 from each other.

The first cable conduit 114a includes an outer body 304. The outer body 304 is a metal or a metal alloy and surrounds each of the power cables 312, 314 and the one or more signal cables 315. The outer body 304 prevents cross-talk or interference from outside electrical lines or power sources, and in one example, may act as a Faraday shield. The outer body 304 therefore serves to shield each of the power cables 312, 314 and the one or more signal cables 315. The outer body 304 further serves to protect each of the power cables

312, 314 and the one or more signal cables 315 from tampering or damage, and organizes the power cables 312, 314 and the one or more signal cables 315. The outer body 304 is segmented, such that the outer body 304 may be curved or shaped. The outer body 304 includes at least a first portion 328 and a second portion 330. The first portion 328 and the second portion 330 are connected at a joint 326. The first portion 328 extends from an outer surface of the casing 302. A distal end of the first portion 328 furthest from the casing 302 is connected to the second portion 330 at the joint 326. Additional portions may also be utilized and connected at different joints. The direction of the walls of the outer body 304 between the first portion 328 and the second portion 330 are different, such that the second portion 330 extends in a different direction than the first portion 328.

As shown in FIG. 3B, the casing 302 includes several passages 320, 322, 324 disposed therein. Each of the passages 320, 322, 324 are configured to hold one or more cables, such as the power cables 312, 314 and the one or more signal cables 315. In embodiments described herein, a first passage 320 is configured to have the first power cable 312 disposed therethrough. A second passage 322 is configured to have the second power cable 314 disposed therethrough. A third passage 324 is configured to have the one or more signal cables 315 disposed therethrough. Each of the passages 320, 322, 324 are separated from each other by one or more walls 316, 318. The first passage 320 is separated from the second passage 322 by the first wall 316. The second passage 322 is separated from the third passage 324 by the second wall 318. The walls 316, 318 are configured to shield electromagnetic fields of each of the cables 312, 314, 315 from one another. The walls 316 are formed of a metal or a metal alloy and prevent noise caused by the proximity of each of the cables 312, 314, 315.

In some embodiments, the walls 316, 318, and the outer body 304 are formed of a polymer, such as a plastic material. In embodiments wherein first cable conduit 114a is formed of a polymer, each of the cables 312, 314, 315 are separated by a larger linear distance than in embodiments wherein the cables are disposed within a metal or metal alloy first cable conduit 114a.

The first cable conduit 114a has a length L of greater than about 400 mm, such as greater than about 45000 mm, such as greater than about 500 mm, such as about 500 mm to about 750 mm, such as about 550 mm to about 750 mm. The length L is the linear length and extends along a major axis of the first cable conduit 114a. The major axis is in the direction in which the first passage 320, the second passage 322, and the third passage 324 extend. The length L of the first cable conduit 114a limits the distance between the first pre-clean control module 112a and the first pre-clean process module 106a. The first cable conduit 114a and the second cable conduit 114b are similar.

Figure 4:
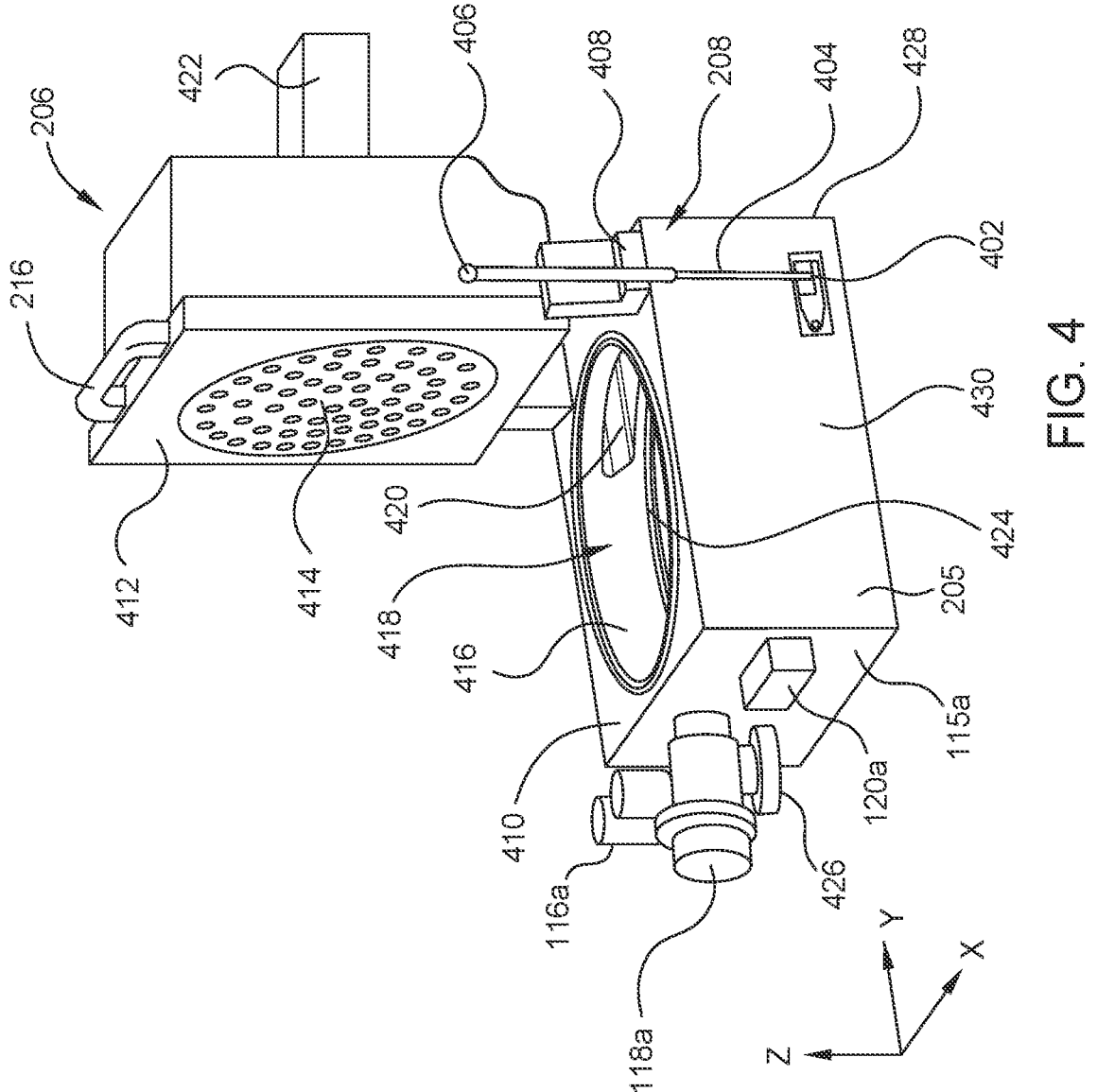
FIG. 4 illustrates a schematic front isometric view of a pre-clean chamber with an open lid, according to embodiments described herein.

FIG. 4 illustrates a schematic front isometric view of a pre-clean chamber 204 with an open lid 206. The pre-clean chamber 204 includes a substrate support pedestal 424, and a plate stack 414 configured to deliver a gas or a plasma to a process volume 418 between the plate stack 414 and the substrate support pedestal 424. The substrate support pedestal 424 is actuated upwards and downwards within a process volume 418 by the pedestal actuator 222. A substrate is configured to be disposed on the substrate support pedestal 424 and cleaned within the pre-clean chamber 204.

The lid 206 is disposed in an open position, such that the lid 206 is actuated about the hinge assembly 208 away from the outward facing surface 115a. The hinge assembly 208 includes a hinge 408 coupled between the body 205 of the pre-clean chamber 204 and the lid 206. The hinge 408 acts as a swivel point or pivot point of the lid 206, such that an axis of rotation of the lid 206 passes through the hinge 408. The hinge assembly 208 further includes an extendable piston 404 coupled to the lid 206 at a first connection point 406 and coupled to the body 205 at a second connection point 402. The extendable piston 404 may alternatively be a spring. The extendable piston 404 is configured to allow the lid 206 to be actuated around the hinge 408, while preventing the lid 206 from passing a pre-determined angle while in an open position. This assists in preventing accidental damage to the lid 206 while the lid 206 is open for maintenance.

The lid 206 includes the plate stack 414 disposed therein as well as the RPS 422. The RPS 422 is configured to deliver plasma to the plate stack 414 during processing. The plate stack 414 includes one or more showerheads, diffusers, and/or ion blocker plates. The plate stack 414 includes a plurality of openings formed through a bottom showerhead to allow gases and plasma within the plate stack 414 to enter the process volume 418. The RPS 422 is configured to provide a plasma to the plate stack 414, such as a cleaning plasma. In some embodiments, the RPS 422 is replaced with a suitable inductively coupled plasma system or a capacitive coupled plasma system.

The process volume 418 is formed using one or more sidewalls 416, a bottom surface of the plate stack 414 and the substrate support pedestal 424. A substrate transfer passage 420 is disposed through one of the sidewalls 416 of the process volume 418 and to an inner facing surface 428. The substrate transfer passage 420 is configured to enable a substrate to pass therethrough, such that the substrate is passed from the process volume 418 to the transfer chamber 102 or from the transfer chamber 102 to the process volume 418. The inner facing surface 428 is disposed on the opposite side of the body 205 from the outward facing surface 115a.

Side surfaces 430 are disposed between the inner facing surface 428 and the outward facing surface 115a. An extendable piston 404 may be coupled to each of the side surfaces 430, such that a first extendable piston 404 extends from one side surface 430 to the lid 206 while a second extendable piston 404 extends from an opposite side surface 430 to the lid 206.

The first isolation port 118a may further include an exhaust coupling 426. The exhaust coupling 426 is configured to be attached to the exhaust line 214, such that gas and/or plasma is exhausted from the process volume 418 through the exhaust coupling 426.

Figure 5A:
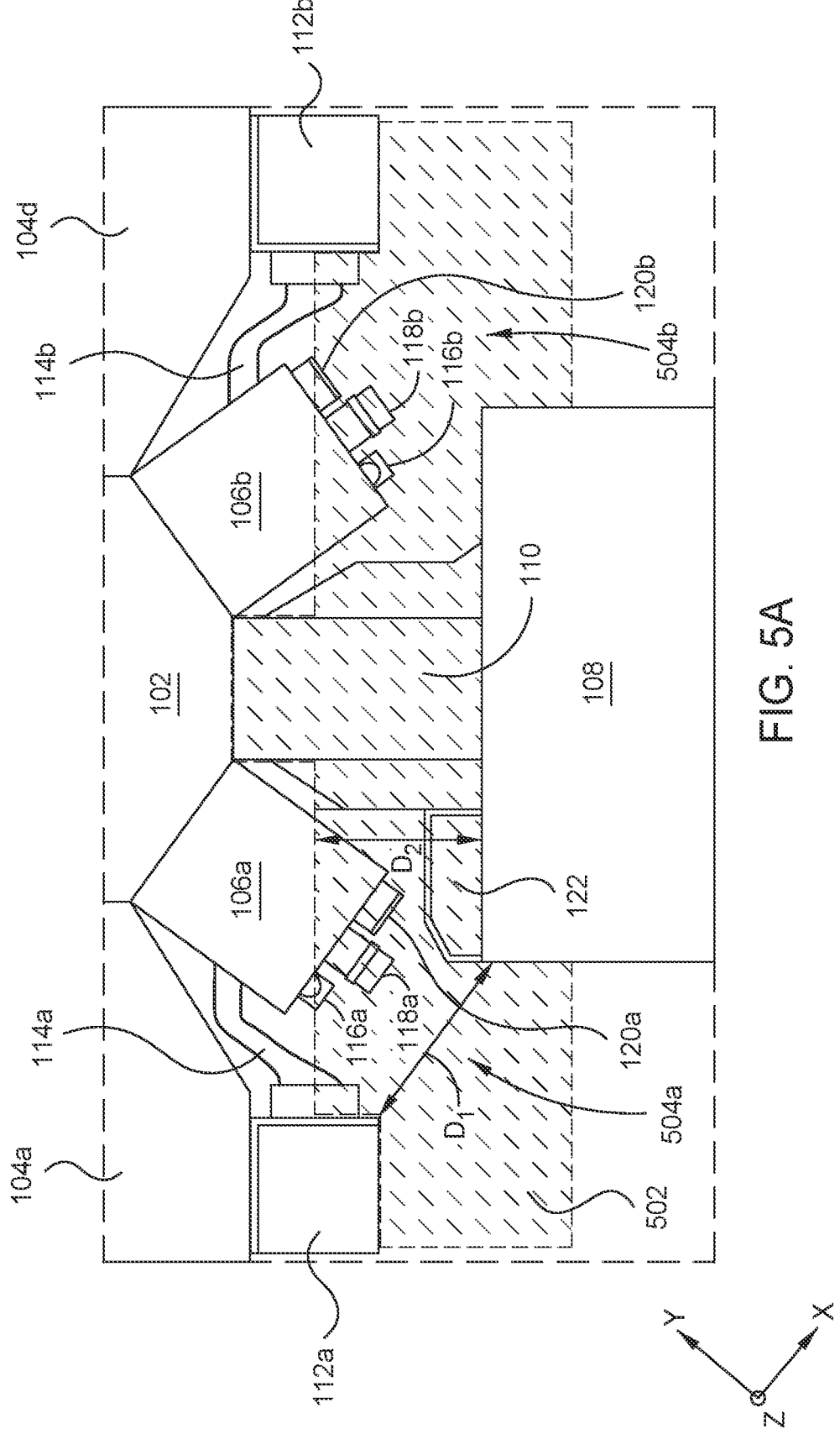
FIG. 5A illustrates a schematic plan view of a part of the cluster tool assembly of FIG. 1 and a maintenance passage, according to embodiments described herein.

FIG. 5A illustrates a schematic plan view of a part of the cluster tool assembly 100 and a maintenance passage 502. The maintenance passage 502 is an open passage through a portion of the cluster tool assembly 100. The maintenance passage 502 is disposed between at least a portion of the first and second pre-clean control modules 112a, 112b, the front end FI 108, the pre-clean process modules 106a, 106b, the mainframe power supply 122, the load lock chamber 110, and the transfer chamber 102. The maintenance passage 502 provides access to each of the pre-clean control modules 112a, 112b, the pre-clean process modules 106a, 106b, the mainframe power supply 122, the load lock chamber 110, and a portion of the transfer chamber 102. In one example, the maintenance passage 502 provides access to a robot or carousel of the transfer chamber 102 from the underside of the transfer chamber 102.

The maintenance passage 502 is therefore disposed between a portion of the pre-clean process modules 106a, 106b and the pre-clean control modules 112a, 112b. The maintenance passage 502 is further disposed between a portion of the pre-clean control modules 112a, 112b and the front end FI 108, such that a first entrance 504a to the maintenance passage 502 is disposed between the first pre-clean control module 112a and the front end FI 108. A second entrance 504b to the maintenance passage 502 is disposed between the second pre-clean control module 112b and the front end FI 108. A first width $D_1$ of the first entrance 504a and the second entrance 504b is greater than about 400 mm, such as greater than about 500 mm, such as about 500 mm to about 750 mm, such as about 500 mm to about 650 mm. The first width $D_1$ of the first entrance 504a is the smallest opening point between an outer surface of one of the pre-clean control modules 112a, 112b and the outer surface of the front end FI 108, such that the first width $D_1$ is the smallest linear distance between one of the pre-clean control modules 112a, 112b and the front end FI 108.

Portions of the maintenance passage 502 pass over each of the cable conduits 114a, 114b, underneath each of the pre-clean process modules 106a, 106b, over the mainframe power supply 122, and over the load lock chamber 110. The portion of the maintenance passage 502 disposed over the load lock chamber 110 provides access to the first wall of an outer perimeter of the transfer chamber 102. A second width $D_2$ is the width of the maintenance passage 502 at a narrowest point within the maintenance passage 502. The second width $D_2$ is disposed between a portion of one of the pre-clean process modules 106a, 106b and the front end FI 108. The second width $D_2$ is a linear distance between a portion of one of the pre-clean process modules 106a, 106b and the front end FI 108. The second width $D_2$ is greater than about 400 mm, such as greater than about 500 mm, such as about 500 mm to about 700 mm, such as about 500 mm to about 625 mm.

Figure 5B:
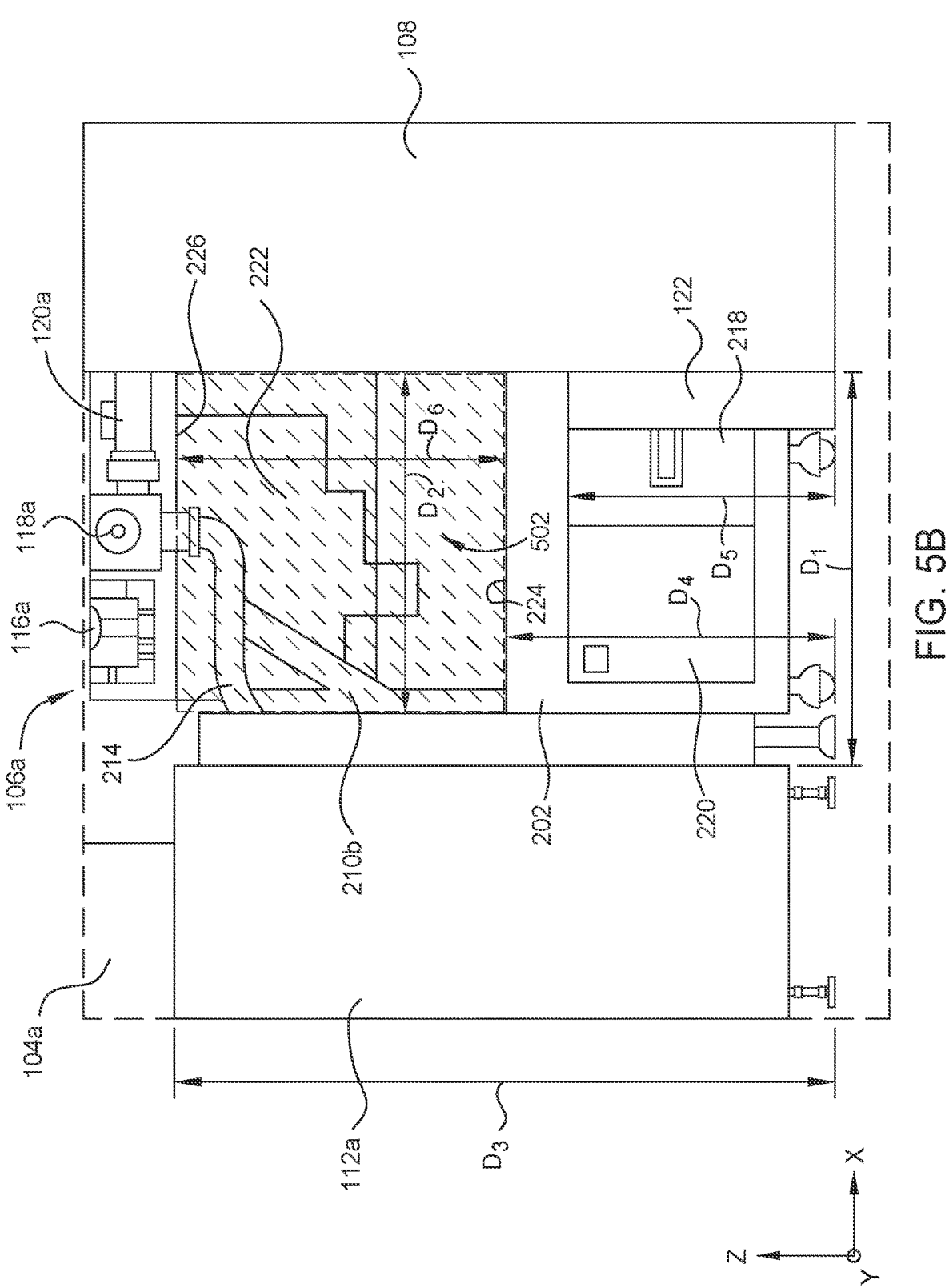
FIG. 5B illustrates a schematic side view of the maintenance passage of FIG. 5A between a first pre-clean process module and a first pre-clean control module.

FIG. 5B illustrates a schematic front isometric view of the maintenance passage 502 between the first pre-clean process module 106a and the first pre-clean control module 112a. Each of the pre-clean control modules 112a, 112b have a first height $D_3$ of greater than about 1000 mm, such as greater than about 1100 mm, such as about 1100 mm to about 1500 mm, such as about 1100 mm to about 1300 mm. The first height $D_3$ is a height in a z-direction from a floor of a fabrication facility to a top surface of the pre-clean control modules 112a, 112b. The first height $D_3$ of the pre-clean control modules 112a, 112b reduce the ability to perform maintenance by reaching over the pre-clean control modules 112a, 112b. The height of the front end FI 108 is a similar or greater height than the pre-clean control modules 112a, 112b.

The gas panel 202 has a second height $D_4$. The second height $D_4$ is about 250 mm to about 500 mm, such as about 300 mm to about 450 mm, such as about 300 mm to about 400 mm, such as about 350 mm to about 400 mm. The second height $D_4$ is a height in a z-direction from a floor of a fabrication facility to the top surface 224 of the gas panel 202. The second height $D_4$ is configured to enable a technician or other personnel to access components disposed above the top surface 224 of the gas panel 202 as well as each of the purge gas panel 220 and the process gas panel 218.

The mainframe power supply 122 has a third height $D_5$. The third height $D_5$ is about 250 mm to about 500 mm, such as about 300 mm to about 450 mm, such as about 300 mm to about 400 mm, such as about 350 mm to about 400 mm. The third height $D_5$ is a height in a z-direction from a floor of a fabrication facility to a top surface of the mainframe power supply 122. The third height $D_5$ enables a technician or other personnel to access the mainframe power supply 122, while still having horizontal clearance to move through the maintenance passage 502.

The maintenance passage 502 has a fourth height $D_6$. The fourth height $D_6$ is about 400 mm to about 675 mm, such as about 450 mm to about 625 mm, such as about 475 mm to about 615 mm. The fourth height $D_6$ is a height in a z-direction from the top surface 224 of the gas panel 202 to the bottom surface 226 of the body 205 of the pre-clean chamber 204. The fourth height $D_6$ is the height of the smallest openings through the maintenance passage 502, such that there is a fourth height $D_6$ of clearance as an individual passes through the entirety of the maintenance passage 502.

The fourth height $D_6$ and the second width $D_2$ form a vertical plane through the maintenance passage 502. The vertical plane is a cross section of the smallest passage through the maintenance passage 502, such that the vertical plane has an area of greater than about 250,000 mm², such as greater than about 300,000 mm². In some embodiments, the vertical plane has an area of about 250,000 mm² to about 325,000 mm², such as about 300,000 mm² to about 325,000 mm².

The area of the cross section through the maintenance passage 502 is large enough to allow a technician or other personnel to pass therethrough and perform maintenance on any of the pre-clean control modules 112a, 112b, the pre-clean process modules 106a, 106b, the mainframe power supply 122, the load lock chamber 110, and/or the transfer chamber 102. The formation of a single maintenance passage 502 assists in reducing the overall footprint of the cluster tool assembly 100 and improves the ease of performing maintenance on the cluster tool assembly 100. The separation of the pre-clean control modules 112a, 112b into separate towers from the pre-clean process modules 106a, 106b enables the space around the pre-clean process modules 106a, 106b to be unobstructed. The cable conduits 114a, 114b couple the pre-clean process modules 106a, 106b and the pre-clean control modules 112a, 112b and enable the separation of the pre-clean control modules 112a, 112b from the pre-clean process modules 106a, 106b while shielding power and signal cables therein from interference.

The gas panels 202 are disposed below each of the pre-clean process modules 106a, 106b and are accessible from the outward facing surfaces 115a, 115b. Similarly, each of the manometers 116a, 116b, the isolation ports 118a, 118b, and the throttle valves 120a, 120b extend from the outward facing surfaces 115a, 115b of each pre-clean process modules 106a, 106b to enable improved access to each of the manometers 116a, 116b, the isolation ports 118a, 118b, and the throttle valves 120a, 120b. Each of the doors of the gas panels 202, manometers 116a, 116b, the isolation ports 118a, 118b, and the throttle valves 120a, 120b are each accessible from the same side and therefore enable reduced clearances on other sides of the pre-clean process modules 106a, 106b.

While the foregoing is directed to embodiments of the present disclosure, other and further embodiments of the disclosure may be devised without departing from the basic scope thereof, and the scope thereof is determined by the claims that follow.

The invention claimed is:

1. An apparatus for substrate processing suitable for use in semiconductor manufacturing, comprising:
   a transfer chamber;
   a factory interface coupled to a first side of the transfer chamber;

one load lock chamber disposed between the transfer chamber and the factory interface to provide substrate transfer access through the one load lock chamber from the factory interface to the transfer chamber, wherein a first valve is disposed between the one load lock chamber and the factory interface and a second valve is disposed between the one load lock chamber and the transfer chamber and the one load lock chamber is disposed between a first pre-clean process module and a second pre-clean process module such that a maintenance passage is disposed between at least the first pre-clean process module and the factory interface and the second pre-clean process module and the factory interface;
   a plurality of process chambers coupled to a plurality of second sides of the transfer chamber;
   the first pre-clean process module coupled to a second side of the transfer chamber between the one load lock chamber and at least one of the plurality of process chambers, wherein the first pre-clean process module is in direct communication with the transfer chamber, the first pre-clean process module comprising a pre-clean chamber and a gas panel disposed below the pre-clean chamber;
   a first pre-clean control module disposed separate from the first pre-clean process module and adjacent to one of the plurality of process chambers, the first pre-clean control module comprising a power source and a controller; and
   a cable conduit disposed between the first pre-clean process module and the first pre-clean control module, wherein:
      the first pre-clean control module is spaced in a separate tower from the first pre-clean process module,
      one or more power cables pass from the power source through the cable conduit to the first pre-clean process module, and
      one or more signal cables pass from the controller through the cable conduit to the first pre-clean process module.

2. The apparatus of claim 1, wherein the cable conduit comprises a plurality of shielded compartments, the plurality of shielded compartments configured so that the one or more power cables pass through a different shielded compartment than the one or more signal cables.

3. The apparatus of claim 1, wherein the cable conduit comprises a metal, a metal alloy, or a polymer.

4. The apparatus of claim 1, wherein the pre-clean chamber further comprises a remote plasma source, a substrate support pedestal, and a plate stack configured to deliver a gas or a plasma to the substrate support pedestal.

5. The apparatus of claim 1, wherein the pre-clean chamber is coupled to the transfer chamber at an inward side and further comprises a lid with an axis of rotation adjacent to the transfer chamber, such that the lid rotates towards the transfer chamber when opening.

6. The apparatus of claim 5, wherein each of an isolation valve, a manometer, and a throttle valve extend from an outward side of the pre-clean chamber opposite the inward side of the pre-clean chamber.

7. The apparatus of claim 1, wherein the gas panel further comprises a purge gas panel and a process gas panel.

8. The apparatus of claim 1, wherein the maintenance passage comprises a width of greater than about 400 mm.

9. An apparatus for substrate processing suitable for use in semiconductor manufacturing, comprising:
   a transfer chamber;

a factory interface coupled to a first side of the transfer chamber;

one load lock chamber disposed between the transfer chamber and the factory interface to provide substrate transfer access through the one load lock chamber from the factory interface to the transfer chamber, wherein a first valve is disposed between the one load lock chamber and the factory interface and a second valve is disposed between the one load lock chamber and the transfer chamber and the one load lock chamber is disposed between a first pre-clean process module and a second pre-clean process module such that a maintenance passage is disposed between at least the first pre-clean process module and the factory interface and the second pre-clean process module and the factory interface;

a first process chamber, a second process chamber, a third process chamber, and a fourth process chamber coupled to the transfer chamber;

the first pre-clean process module coupled to a second side of the transfer chamber between the one load lock chamber and the first process chamber, wherein the first pre-clean process module is in fluid communication with the transfer chamber, the first pre-clean process module comprising a first pre-clean chamber and a first gas panel disposed below the first pre-clean chamber, the first pre-clean chamber coupled to the transfer chamber and further comprising a lid with an axis of rotation adjacent to the transfer chamber, such that the lid rotates towards the transfer chamber when opening;

a first pre-clean control module disposed separate from the first pre-clean process module and adjacent to the first process chamber, the first pre-clean control module comprising a first power source and a first controller configured to control a pre-clean process within the first pre-clean chamber;

a first cable conduit disposed between the first pre-clean process module and the first pre-clean control module and configured to hold one or more power cables and one or more signal cables therein, wherein the first pre-clean control module is spaced in a first separate tower from the first pre-clean process module, and wherein one or more power cables pass from the first power source through the first cable conduit to the first pre-clean process module, and wherein one or more signal cables pass from the first controller through the first cable conduit to the first pre-clean process module;

the second pre-clean process module coupled to a seventh side of the transfer chamber between the one load lock chamber and the fourth process chamber, wherein the second pre-clean process module is in fluid communication with the transfer chamber, and wherein the second pre-clean process module comprises a second pre-clean chamber and a second gas panel disposed below the second pre-clean chamber;

a second pre-clean control module disposed separate from the second pre-clean process module and adjacent to the fourth process chamber, the second pre-clean control module comprising a second power source and a second controller configured to control the pre-clean process within the second pre-clean chamber; and a second cable conduit disposed between the second pre-clean process module and the second pre-clean control module and configured to hold one or more power cables and one or more signal cables therein, wherein the second pre-clean control module is spaced in a second separate tower from the second pre-clean process module and wherein one or more power cables pass from the second power source through the second cable conduit to the second pre-clean process module, wherein one or more signal cables pass from the second controller through the second cable conduit to the second pre-clean process module, and wherein the one load lock chamber is disposed between the first pre-clean process module and the second pre-clean process module.

10. The apparatus of claim 9, wherein a distance between the first pre-clean control module and the one load lock chamber is greater than about 500 mm.

11. The apparatus of claim 9, wherein a distance between the second pre-clean control module and the one load lock chamber is greater than about 500 mm.

* * * * *